United States Patent [19]

Nishihara et al.

[11] 4,150,421
[45] Apr. 17, 1979

[54] MULTI-LAYER PRINTED CIRCUIT BOARD

[75] Inventors: Mikio Nishihara, Yokohama; Kyoichiro Kawano, Kawasaki, both of Japan

[73] Assignee: Fujitsu Limited, Kawasaki, Japan

[21] Appl. No.: 896,772

[22] Filed: Apr. 17, 1978

[30] Foreign Application Priority Data

Apr. 19, 1977 [JP] Japan .................................... 52-44694

[51] Int. Cl.² .............................................. H05K 5/00
[52] U.S. Cl. .................................... 361/410; 361/414; 174/68.5
[58] Field of Search ..................... 361/414, 410, 409; 174/68.5

[56] References Cited

U.S. PATENT DOCUMENTS

| 3,571,923 | 3/1971 | Shaheen | 174/68.5 |
| 3,726,002 | 4/1973 | Greenstein et al. | 174/68.5 |
| 3,898,370 | 8/1975 | Davy et al. | 361/414 |
| 3,923,359 | 12/1975 | Nensam | 361/414 |

*Primary Examiner*—David Smith, Jr.
*Attorney, Agent, or Firm*—Daniel Jay Tick

[57] ABSTRACT

A multi-layer printed circuit board has a through hole extending therein outside the mounting portion of a component mounted on the surface layer of the board. The component has a lead pad on the surface layer of a first printed circuit board and a modification pad on the surface layer between the through hole and the lead pad. The through hole extends through the first board to inside the mounting portion via a pattern of an internal wiring layer of the board. A second printed circuit board is joined to the first board at the internal layers of each to form a unitary integrated circuit board. Another through hole extends through the first and second boards inside the mounting portion of the integrated printed circuit board. The pattern and a selected wiring layer of the second board are thereby connected via the other through hole. Additional through holes extend through the second board and interconnect the layers of the second board. The additional through holes are positioned in areas devoid of the first-mentioned through hole.

4 Claims, 8 Drawing Figures

MULTI-LAYER PRINTED CIRCUIT BOARD

BACKGROUND OF THE INVENTION

The present invention relates to a multi-layer printed circuit board. More particularly, the invention relates to a high density and remoldable multi-layer printed circuit board which is capable of mounting a mulit-lead element such as a Large Scale Integrated Circuit or LSI.

Present multi-layer printed circuit boards are formed with very high density, so that the number of boards used is reduced, resulting in an increased cost per board. Thus, when a minor change is required in the printed circuit, it is desirable to make a minor modification in the necessary portion of the fabricated board, instead of entirely remolding a new board. A method has been devised to attain this purpose.

In the devised method, the printed patterns for modification are provided at the surface layer and the pattern to be cut is cut with a knife at the surface of board. The modification is then undertaken by providing wire bonding between the patterns to be connected. However, since it is necessary, after mounting the LSI, to also provide modification patterns in portions hidden under the LSI, modification of board is impossible once the LSI is mounted. This is due to the fact that although it is desirable to provide the modification patterns in correspondence with the lead pads for bonding the leads of the LSI, if all the modification patterns are provided outside the LSI mounting portion, the plated through holes for guiding modification patterns to the internal layers of the board are concentrated in surrounding the mounting portion of the LSI. This makes it inconvenient to design wiring patterns of the internal layers. It is thus necessary to provide the modification patterns inside or outside the LSI mounting portion with adequate distribution.

The principal object of the invention is to provide a multi-layer printed circuit board which permits alteration of wiring patterns with facility, convenience and ease, even after a multi-lead element such as a LSI is mounted.

An object of the invention is to provide a multi-layer printed circuit board ensuring excellent wiring efficiency, wherein all modification patterns are provided at the outside of the LSI mounting portion and wiring patterns of internal layers may be designed with facility, convenience and ease.

Another object of the invention is to provide a multi-layer printed circuit having through holes for guiding modification patterns to the internal layer which are not concentrated in surrounding the LSI mounting portion, despite the fact that all the modification patterns are provided outside the LSI mounting portion.

BRIEF SUMMARY OF THE INVENTION

Each of a plurality of printed circuit boards is individually manufactured through a multi-laying process and a through hole plating process. The boards are further layered and the plated through holes are provided in the integrated board. More particularly, pads to which the leads of the LSI are bonded and modification patterns connected to the pads and formed outside the LSI mounting portion are provided on the surface layer of a first printed circuit board. The modification pattern is guided to the rear layer of the first printed circuit board. At the rear layer, the wiring pattern leads the through holes to the area under the LSI mounting portion. A second printed circuit board has a plurality of wiring layers and through holes for interconnecting such layers.

The through holes for connecting the pattern at the rear layer of the first printed circuit board to the desired layer of the second printed circuit board are formed in the layered board of the first and second printed circuit boards within the LSI mounting portion through said first and second printed circuit boards.

The aforedescribed structure permits several patterns to be connected to the internal layer via the through holes in the LSI mounting portion via the patterns at the rear layer of the first printed circuit board even when all the modification patterns are provided outside the LSI mounting portion. Furthermore, a through hole independent of the aforedescribed through holes is formed in the second printed circuit board positioned under said through holes in the first printed circuit board, wiring patterns of the internal layer may thus be designed with facility, convenience and ease, and an efficient selection of wiring paths is thus insurable.

In accordance with the invention, a multi-layer printed circuit board comprises a first multi-layered printed circuit board having a surface layer, an opposite substantially parallel internal layer having a wiring pattern, and plated through holes extending therethrough from the surface layer to the internal layer and connecting the surface layer to the internal layer. A component is mounted on the surface layer of the first board over a mounting portion for the component on the surface layer. The component has leads. Lead pads are provided on the surface layer of the first board for connecting the leads of the component. Modification pads are provided on the surface layer of the first board. The modification pads are connected to the lead pads and formed outside the mounting portion for the component. The wiring pattern of the internal layer of the first board extends the modification pads to inside the mounting portion for the component. A second multi-layered printed circuit board has a plurality of wiring pattern layers, an internal layer, and plated through holes extending therethrough from the internal layer thereof and connecting the wiring pattern layers. An additional plated through hole extends through the first and second boards inside the mounting portion for the component and connects the internal layer of the first board to a selected wiring pattern layer of the second board. The first and second boards are joined to each other at their internal layers to form a unitary integrated circuit board.

The lead pads and the modification pads are provided in equal numbers. Each of the modification pads is connected to a corresponding one of the lead pads.

The first and second boards have another plated through hole extending therethrough outside the mounting portion for the component and connecting at least one of the pads to the selected wiring pattern layer of the second board.

Selected ones of the plated through holes extending through the second board from the internal layer thereof are positioned under the lead pads on the surface layer of the first board.

BRIEF DESCRIPTION OF THE DRAWINGS

In order that the invention may be readily carried into effect, it will now be described with reference to the accompanying drawings, wherein.

In the figures, the same components are identified by the same reference numerals.

DETAILED DESCRIPTION OF THE INVENTION

Figure 1:
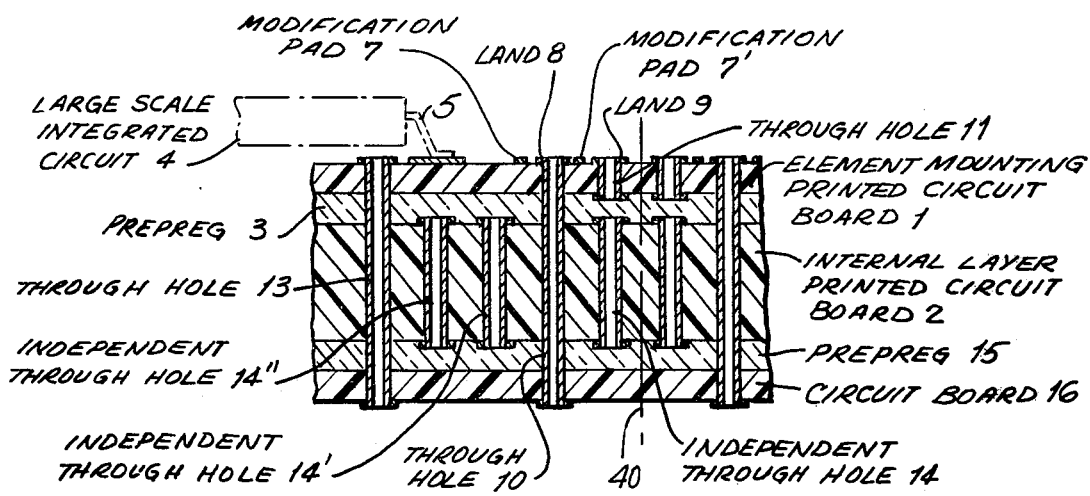
FIG. 1 is a cross-sectional view of part of an embodiment of the multi-layer printed circuit board of the invention.

The problems of known multi-layer printed circuit boards are explained with reference to FIGS. 5 to 8. In FIGS. 5 to 8, the internal layers of a multi-layer printed circuit board 20 are omitted. A LSI is mounted on the board 20 and has leads 5. Lead pads 6 and 6' bond the leads 5. Plated through holes 21 to 25 (FIGS. 5 and 6) and 31 to 35 (FIGS. 7 and 8) are provided in the printed circuit board 20. Modification pads 26 to 28 (FIGS. 5 and 6) and 36 to 39 (FIGS. 7 and 8) are wire-bonded with other pads at the time of modification.

The pattern is symmetrical about a line 40 in the figures. A lattice indicated by a thin line in FIGS. 6 and 8 indicates the standard lattice imaginarily estimated at the time of pattern design. In general, the through holes are formed at the crosspoints of the standard lattice.

Figure 5:
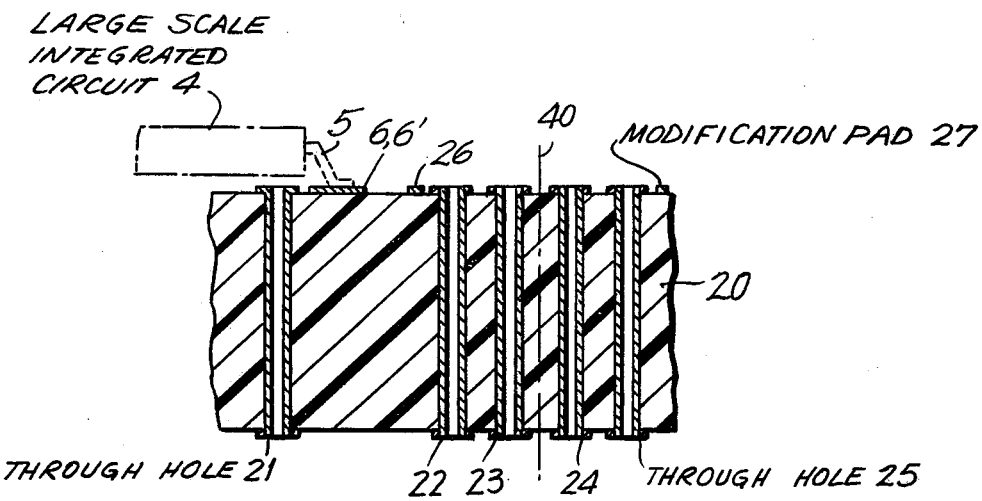
FIG. 5 is a cross-sectional view of part of a known embodiment of a printed circuit board.
Figure 6:
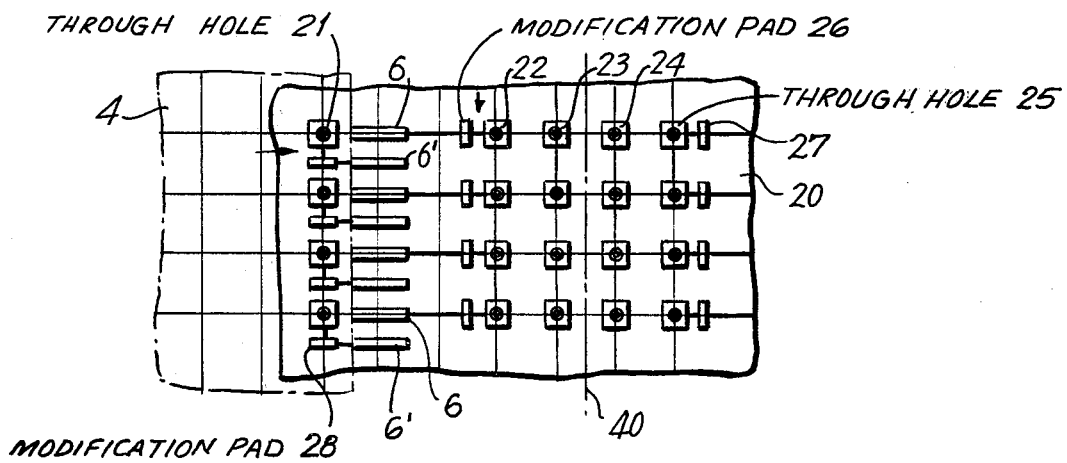
FIG. 6 is a top plan view of the embodiment of FIG. 5.

In the known printed circuit boards shown in FIGS. 5 and 6, the lead pads 6 provided at the crosspoints of the standard lattice are connected to the through holes 22 and 25 provided outside the LSI mounting portion 4 via the modification pads 26 and 27, respectively, in FIGS. 5 and 6. The lead pads 6' provided between the crosspoints of the standard lattice are connected to the through holes 21 formed inside of the LSI mounting portion via the modification pads 28 in the embodiment of FIGS. 5 and 6.

In the embodiment of FIGS. 5 and 6, the through holes 21, 22 and 25 guide the modification pads 28, 26 and 27 to the desired internal layer. The through holes 23 and 24 interconnect the internal layers. It is impossible to provide through holes under the lead pads 6 and 6'. The board may be modified by cutting the modification pattern at the part indicated by the arrow in FIG. 6 with a knife and then wire-bonding the modification pads 26, 27 or 28 to the desired pad.

Since the modification pads of the known printed circuit board of FIGS. 5 and 6 are provided within the LSI mounting portion, modification of the board after mounting the LSI is impossible. Furthermore, in some instances, wires used for modification cross over the lead pad area from inside to outside the LSI mounting portion. This is a factor which increases the difficulty of mounting the LSI, even when the modification is undertaken prior to the mounting of the LSI.

Figure 7:
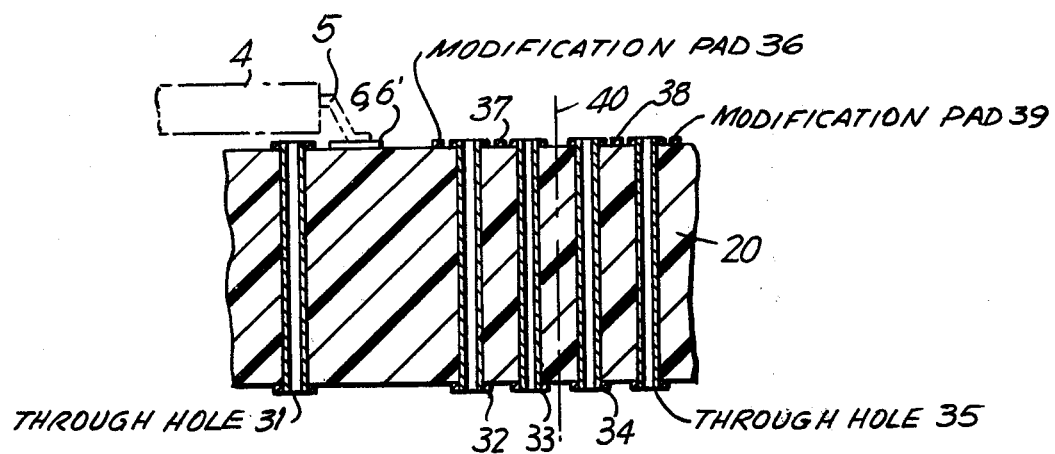
FIG. 7 is a cross-sectional view of part of another known embodiment of a printed circuit board.
Figure 8:
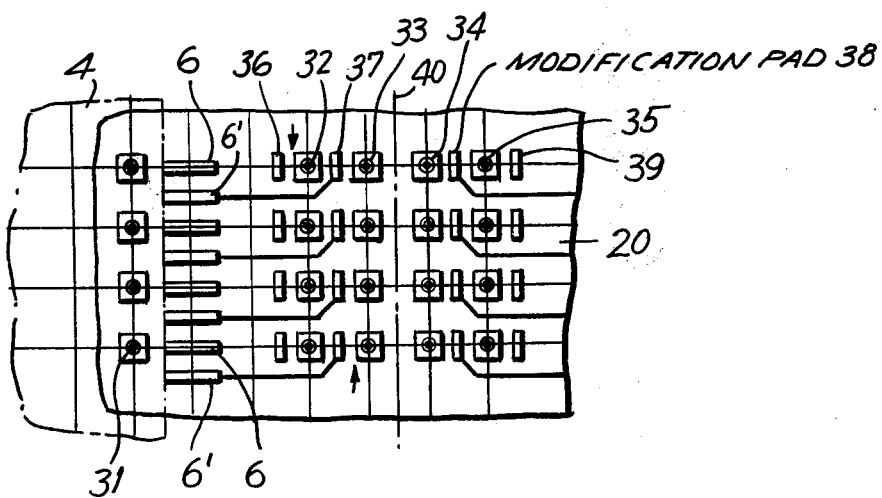
FIG. 8 is a top plan view of the embodiment of FIG. 7.

The aforedescribed disadvantage seems to be eliminated in the known embodiment of the printed circuit board shown in FIGS. 7 and 8. In the embodiment of FIGS. 7 and 8, the modification pads 36 to 39 corresponding to the lead pads 6 and 6' are provided outside the LSI mounting portion, and the through holes 32 to 35 for guiding said modification pads to the internal layer are also provided outside the LSI mounting portion. The through holes 31 interconnect the internal layers.

In the printed circuit board of FIGS. 7 and 8, the through holes 32 to 35 for the modification pads are concentrated in a specific area. Furthermore, it is difficult to design the wiring patterns of the internal layers, since the through holes cannot be provided under the lead pads 6 and 6'. That is, the space for providing through holes for interconnecting internal layers cannot be obtained outside the LSI mounting portion. The interconnecting of internal layers is thus possible only inside the LSI mounting portion.

The only difference between the embodiments of FIGS. 6 and 8 seems to be an interchange of the function of the through holes 21 and 33, and between the through holes 23 and 31. In other words, the number of through holes of the modification pads and the number of through holes interconnecting the internal layers are the same in the board as a whole, and the only difference seems to be in arrangement of the through holes. In FIG. 6, both types of through holes are positioned almost uniformly, whereas in FIG. 8, both types of through holes are concentrated. However, such a difference is a considerable problem for designers of internal patterns.

The through hole for connecting a land of a specific internal layer to a land of another internal layer is most effectively provided in the interval between such lands. In the printed circuit board shown in FIG. 8, however, the through holes for interconnecting the internal layers cannot be provided in an extended wide area. Even when the land of a specific layer and the land of another layer are located adjacent each other, the through holes for connecting the lands must thus be provided at a distance in some cases. In such cases, the connecting path becomes undesirably long. Furthermore, in design automation, where the internal layer patterns are designed automatically by a computer, the design software becomes complex in the embodiment of FIG. 8.

When two lands to be connected between layers are located in one LSI mounting portion, or when one land is located in one LSI mounting portion, while the other land is located in another LSI mounting portion, and when both lands are outside the LSI mounting portion, it is necessary to change the method of searching the position in order to provide the through holes for interconnecting the layers in accordance with the respective case. On the other hand, in the embodiment of the printed circuit board of FIG. 6, the crosspoints of the lattice where the through holes for interconnecting the layers may be provided are distributed almost uniformly. Therefore, in the aforedescribed case, it would be unnecessary to change the method of searching the position in order to provide through holes.

The multi-layer printed circuit board of the invention solves the problems of insufficient remoldability of the board of the embodiment of FIGS. 5 and 6, difficulty in design and inefficiency in wiring of the board of the embodiment of FIGS. 7 and 8. The multi-layer printed circuit board of the invention also permits the positioning of the through holes for interconnecting layers in such area as that under the lead pads 6 and 6', where it has never before been possible to provide the through holes.

A preferred embodiment of the invention is now described with reference to FIGS. 1 to 4.

The multi-layer printed circuit board of the invention is integrated into a form of multi-layer board with a sheet of prepreg obtained by impregnating a resin into glass cloth. The prepreg is sandwiched between an element mounting printed circuit board 1, referred to as the first board, and an internal layer printed circuit board 2, hereinafter referred to as the second board. Each of the first and second boards is individually formed in accordance with a respective pattern. The second board 2 is for wiring.

The first board 1 itself has a plurality of wiring layers and is provided primarily for mounting the LSI 4, and provides a connecting pattern for connecting the lead pads 6 and 6' to the internal layers and simultaneously provides a modification pattern. The lead pads 6, 6', 6, 6', and so on, are provided at equal intervals on the surface layer of the first board 1 for bonding flat leads 5 of the LSI 4.

The lead pads 6, at the crosspoints of the standard lattice, are connected to lands 8 on lines via modification pads 7. The lead pads 6', between the crosspoints of the standard lattice, are extended to modification pads 7' provided on extended lines of the lands 8 and are extended to lands 9 via the bonding pattern. The lands 8 are connected directly to the second board 2 via through holes 10 and the lands 9 are connected to the second board via through holes 11 of the first board, patterns 12 of the internal layer of the first board and through holes 13. The through holes 13 are located inside the mounting portion of the LSI 4.

Figure 2:
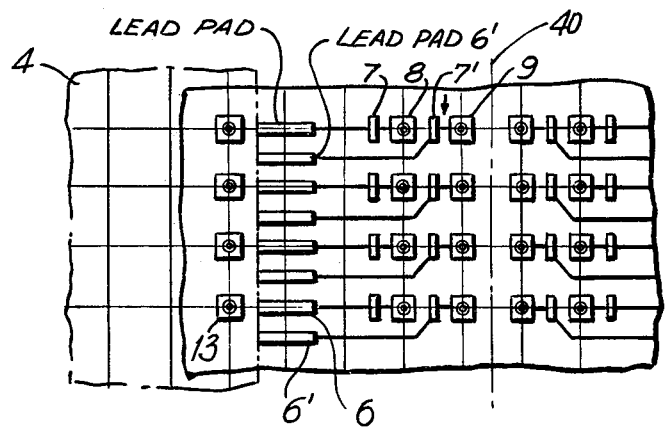
FIG. 2 is a top plan view of the embodiment of FIG. 1.
Figure 3:
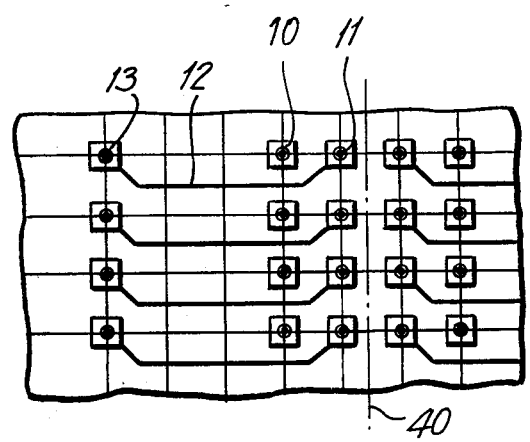
FIG. 3 is a top plan view of the rear layer of the first printed circuit board of the embodiment of FIG. 1.
Figure 4:
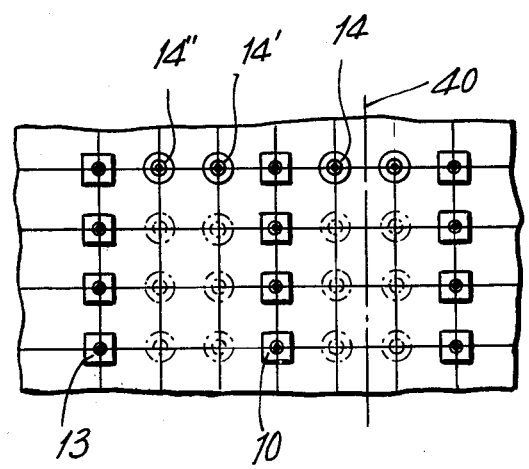
FIG. 4 is a top plan view of an embodiment of an internal layer of the second printed circuit board of the embodiment of FIG. 1.

The lead pads are directly drawn at the surface of the printed circuit board to the through holes provided at the same position as the through holes of the embodiment of FIG. 6. In the embodiment of FIGS. 1 and 2, however, the first board 1 is layered and the lead pads to be drawn inside the LSI mounting portion are once drawn out to the outside at the surface of said first board and then drawn into the through holes 13 inside the LSI mounting portion from the inside of said first board via the through holes 11.

The second board 2 has almost the same configuration as the internal layers of the known multi-layer printed circuit board shown in FIGS. 5 and 6. Independent through holes 14, 14' and 14'' are provided at the crosspoints of the standard lattice when the second board 2 is in a position where there are no through holes 10 and 13 for connection to the internal layer as the paths. Therefore, by providing many through holes or paths 14, 14', 14'' connections between layers in the second board 2 may be made via the shortest route. The first and second boards 1 and 2 may be connected via the through holes 10 and 13.

In the manufacture of the multi-layer printed circuit board of the invention, the first and second boards are separately manufactured and patterns or through holes are formed in said boards. Thus, the first board 1, the second board 2 and the prepreg 3 sandwiched between said boards are integrated into a multi-layer. Thereafter, holes are drilled through both boards and then the through hole plating is provided. Then, the through holes 10 and 13 for connecting the first and second boards 1 and 2, respectively, are formed. Thereafter, the flat leads 5 of the LSI 4 are provided on the lead pads 6, 6', 6, 6', and so on, of the first board 1 and are fixed by reflow soldering, etc.

Although only one side and the top part of the LSI 4 are shown in the figures, the LSI terminals may be positioned, as required, as shown in the figures. Furthermore, in the figures, the right side of the broken line 40 indicates the patterns and through holes corresponding to the adjacent LSI which is not illustrated. It is also possible to add a third circuit board 16 as a layer to the rear surface of the second board 2 via prepreg 15, as required.

The pattern of the printed circuit board of the invention may be modified without removing the LSI, as hereinafter explained. The lead pads 6 at the crosspoints of the standard lattice are connected to the second board 2 via the modification pads 7, the lands 8 and the through holes 10. It is desired to modify the patterns due to a change of specification or an error in design. The pattern between the desired modification pad 7 and the land 8 must be separated from said land by cutting it at the position indicated by the arrow in FIG. 2. An end of a wire is then bonded to the modification pad 7 and the other end of the wire is rewired to the other part of the board.

The lead pads 6' intermediate the crosspoints of the standard lattice are also connected to the other position in the same manner by cutting the pattern at the position indicated by the arrow in FIG. 2 and by wire bonding to the modification pad 7'. At such time, although the interval between the modification pad 7' and the land 9 is cut outside the LSI 4 mounting portion, since said land 9 is drawn to the through hole 13 inside the LSI mounting portion via the pattern 12 inside the first board 1, the modification pad 7' of the lead pad 6' and the through hole 13 inside the LSI mounting portion are disconnected. Therefore, pattern disconnection and wiring may be provided for all the terminals of the LSI without removing said LSI. Furthermore, the disconnection and wiring may be accomplished at the surface of the printed circuit board. Modification is thus achieved with facility, convenience and ease.

Although the through holes 11 for extension are provided outside the LSI mounting portion, since the through holes 13 for connecting the first board to the second board are provided inside the LSI mounting portion, the paths 14 may be provided at the lower positions of the extension through holes 11 of the second board 2. Thus, the concentration of the through holes for modification pads outside the LSI mounting portion, as in the embodiment of FIGS. 7 and 8, may be substantially eliminated. Furthermore, areas devoid of the through holes 13 and 10 for connection at the crosspoints of the standard lattice are vacant. The through holes 14' and 14'' may therefore be provided in addition to the through hole or path 14, and may also be used as paths.

More particularly, the paths seen when viewing from the surface of the printed circuit board, which may be used only at the internal layers, may be provided with a sufficient margin at the second board 2, although the lead pads 6 and 6' and the extension through holes 11 are provided. Furthermore, since the paths and through holes for connecting the first board 1 to the second board 2 are scattered, the pattern design may be made freely by determining the shortest route by means of design automation.

The wiring efficiency is therefore drastically improved and a pattern design of higher density may be realized. Elements other than a LSI may also be mounted at the lead pads 6 and 6', as long as such elements are multi-lead units having a small lead pitch.

The third circuit board 16 may be layered over the rear surface of the second board 2, as required, via the prepreg 15, as shown in FIG. 1. The third board 16 should have a multi-layer structure and through holes for itself. As hereinbefore described, it is generally recommended that the modification pads be provided adjacent the lead pads or terminal pads on a one to one basis. The lead pads are the pads to which the leads of mounted parts are electrically connected. The terminal pads are the pads used as terminals for connecting the printed circuit board to another printed circuit board, or to other devices.

An important function of the printed circuit board is to establish the connection between the aforedescribed pads. Therefore, on the occasion of modification, it is easier to provide new wiring directly between pads than to provide modification in the course of wiring the circuit. Furthermore, if an unwanted long signal line is left connected to a lead, its stray capacitance affects the circuit characteristic adversely. It is thus preferable to provide the modification pads in positions near to the lead pads or terminal pads.

While the invention has been described by means of a specific example and in a specific embodiment, we do not wish to be limited thereto, for obvious modifications will occur to those skilled in the art without departing from the spirit and scope of the invention.

We claim:

1. A multi-layer printed circuit board, comprising
    a first multi-layered printed circuit board having a surface layer, an opposite substantially parallel internal layer having a wiring pattern, and plated through holes extending therethrough from the surface layer to the internal layer and connecting said surface layer to said internal layer;
    a component mounted on the surface layer of the first board over a mounting portion for the component on said surface layer, said component having leads;
    lead pads on the surface layer of the first board for connecting the leads of the component;
    modification pads on the surface layer of the first board connected to the lead pads and formed outside the mounting portion for the component, the wiring pattern of the internal layer of the first board extending the modification pads to inside the mounting portion for the component; and
    a second multi-layered printed circuit board having a plurality of wiring pattern layers, an internal layer, plated through holes extending therethrough from the internal layer thereof and connecting the wiring pattern layers, and an additional plated through hole extending through the first and second boards inside the mounting portion for the component and connecting the internal layer of the first board to a selected wiring pattern layer of the second board, said first and second boards being joined to each other at their internal layers to form a unitary integrated circuit board.

2. A multi-layer printed circuit board as claimed in claim 1, wherein the lead pads and the modification pads are provided in equal numbers, each of the modification pads being connected to a corresponding one of the lead pads.

3. A multi-layer printed circuit board as claimed in claim 1, wherein said first and second boards have another plated through hole extending therethrough outside the mounting portion of the component and connecting at least one of said pads to the selected wiring pattern layer of the second board.

4. A multi-layer printed circuit board as claimed in claim 1, wherein selected ones of the plated through holes extending through said second board from the internal layer thereof are positioned under the lead pads on the surface layer of the first board.

* * * * *